United States Patent [19]

Carlqvist

[11] Patent Number: 4,573,024
[45] Date of Patent: Feb. 25, 1986

[54] PLL HAVING TWO-FREQUENCY VCO

[75] Inventor: Bengt R. Carlqvist, Bromma, Sweden

[73] Assignee: Telefonaktiebolaget L M Ericsson, Stockholm, Sweden

[21] Appl. No.: 522,162

[22] PCT Filed: Nov. 25, 1982

[86] PCT No.: PCT/SE82/00399
§ 371 Date: Jul. 22, 1983
§ 102(e) Date: Jul. 22, 1983

[87] PCT Pub. No.: WO83/02045
PCT Pub. Date: Jun. 9, 1983

[51] Int. Cl.⁴ .................................... H03L 7/06
[52] U.S. Cl. ........................ 331/1 A; 331/14; 331/17; 331/25
[58] Field of Search ........... 331/1 A, 14, 17, 23, 331/25, 27

[56] References Cited

U.S. PATENT DOCUMENTS

| 4,179,671 | 12/1979 | Yoshida et al. | 331/116 FE |
| 4,330,759 | 5/1982 | Anderson | 331/14 |
| 4,333,060 | 6/1982 | Mosley, Jr. et al. | 331/23 X |
| 4,422,176 | 12/1983 | Summers | 331/127 X |
| 4,513,255 | 4/1985 | Terbrack | 331/1 A |

FOREIGN PATENT DOCUMENTS

| 0131745 | 11/1978 | Japan | 331/17 |
| 1129267 | 10/1968 | United Kingdom | 331/14 |

Primary Examiner—Eugene R. LaRoche
Assistant Examiner—D. C. Mis
Attorney, Agent, or Firm—Roberts, Spiecens & Cohen

[57] ABSTRACT

A phase locked loop for bringing an oscillator (1) into phase with an incoming signal. In accordance with the invention there are means which on the one hand determine whether the phase difference between the oscillator output signal and the incoming signal is positive or negative and on the other hand in response thereto cause the oscillator (1) to emit either of two output signal frequencies, one of which is predeterminately higher while the other is predeterminately lower than the incoming signal frequency. The oscillator (1) is hereby brought into phase with the incoming signal when the former emits its two output signal frequencies alternatingly.

3 Claims, 5 Drawing Figures

PLL HAVING TWO-FREQUENCY VCO

TECHNICAL FIELD

The present invention relates to a method of bringing an oscillator into phase with an incoming signal, together with an apparatus for carrying out the method.

BACKGROUND ART

For bringing an oscillator into phase with an incoming signal it is known to use a so-called phase-locked loop (PLL) which employs analog signal processing. However, such loops are not suitable for interaction with circuits operating digitally and implemented as integrated circuits.

DISCLOSURE OF INVENTION

An object of the present invention is therefore to provide a method for digitally bringing an oscillator into phase with an incoming signal and also to provide an apparatus for carrying out the method, such apparatus being realizable with integrated circuits.

The object is achieved by the method and apparatus in accordance with the invention having been given the characterizing features disclosed in the claims.

BRIEF DESCRIPTION OF DRAWINGS

The invention is described more closely below with reference to the appended drawing, in which.

BEST MODE FOR CARRYING OUT THE INVENTION

Figure 1:
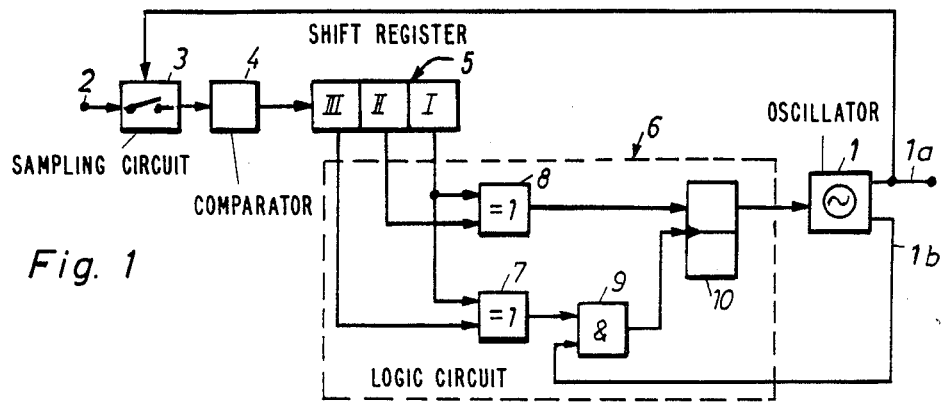
FIG. 1 illustrates an embodiment of the apparatus in accordance with the invention for bringing an oscillator into phase with an incoming signal.
Figure 2:
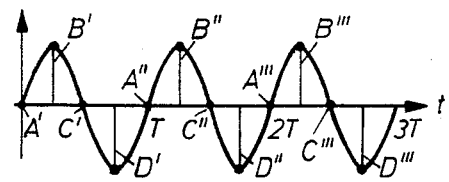
FIG. 2 illustrates the sampling of the incoming signal when the oscillator is brought into phase therewith.

FIG. 1 illustrates an embodiment of an apparatus in accordance with the invention for bringing an oscillator 1 into phase with an incoming signal, and in the illustrated embodiment this signal is assumed to be a biphase-modulated data signal, of which three successive data bits having the same value are shown in FIG. 2. The biphase-modulated data signal is applied to the input 2 of a sampling circuit 3, which is controlled by the output signal of the oscillator 1 at the output 1a. In the embodiment illustrated it is intended to sample the incoming, biphase-modulated data signal four times per bit period T. When the oscillator output signal is in phase with the incoming signal, the samples will be distributed in the manner shown in FIG. 2, where the four samples within the illustrated bit periods are denoted respectively A', B', C', D'; A", B"; C", D" and A''', B''', C''', D'''. In accordance with the invention, the samples are fed to a comparator 4 which is adapted to emit, in response to whether the sample polarity is positive or negative, sequential high or low level signals, i.e. binary ones or zeroes. Accordingly, a series of binary ones and zeroes will occur at the output of the comparator 4, where a one signifies that the corresponding sample was positive, while a zero signifies that the corresponding sample was negative or vice versa.

These ones and zeroes are then applied in order to a shift register 5 having three stages I, II and III in the illustrated embodiment. The shift register outputs are connected to a logic circuit 6 which, on the basis of the contents of the shift register 5, is adapted to determine whether the phase difference between the output signal of the oscillator 1 and the incoming signal to the input 2 is positive or negative, and in response thereto to emit a high or low level signal, i.e. a binary one or zero. In accordance with the invention the oscillator 1 is adapted to emit an output signal at its output 1a, which assumes one of two frequencies in response to the output signal from the logic circuit 6. The frequencies of the oscillator output signal are, in accordance with the invention, so selected that one frequency is predeterminately higher, while the second frequency is predeterminately lower than four times the frequency of the incoming signal at the input 2 according to the example. The oscillator 1 is thus controlled binarily from the logic circuit 6 and is accordingly caused to emit either of its two output signal frequencies to the sampling circuit 3 at its output 1a. At its output 1b the oscillator emits an output signal to the logic circuit 6, the frequency of this signal being half the frequency of the output signal emitted at the output 1a.

In the embodiment illustrated in FIG. 1, the logic circuit 6 includes (a) two EXCLUSIVE-OR gates 7 and 8, each having two inputs and one output, (b) an AND gate 9 having two inputs and one output and (c) a flip-flop 10 having two inputs and one output.

Both the inputs of the EXCLUSIVE-OR gate 7 are connected to the respective output from the shift register stages I and III, while the output is connected to one input of the AND gate 9, the other input of which being connected to output 1b of the oscillator 1, and the output of which, being connected to the trigger input of the flip-flop 10, the output of which in turn being connected to the control input of the oscillator 1.

Both the inputs of the EXCLUSIVE-OR gate 8 are connected to the respective output from the shift register stages I and II, while its output is connected to the data input of the flip-flop 10.

The EXCLUSIVE-OR gates 7 and 8 emit a binary one at the output only when a binary one appears at either input. It is these EXCLUSIVE-OR gates which, on the basis of the binary contents of the stages of the shift register 5, determine whether the output signal of the oscillator 1 is in advance of lagging in phase in relation to the incoming signal. In accordance with the invention, this phase comparison is arranged to have an effect only at every other sampling occasion. This is achieved by means of the AND gate 9, which at its one input receives the oscillator output signal from the output 1b, the frequency of this signal being half the frequency of the output signal emitted at the output 1a, as described above. In the embodiment illustrated, the phase comparison is arranged to take place on the basis of three samples, viz: a B sample, a D sample and an intermediate sample, i.e. an A or a C sample.

Figure 3:
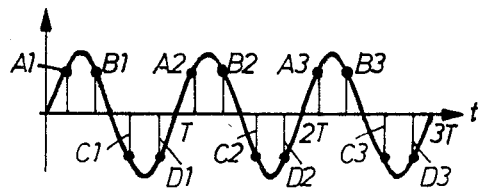
FIG. 3 illustrates the sampling of the incoming signal when the oscillator is out of phase therewith.

Let it now be assumed that a biphase-modulated signal of the type illustrated in FIG. 2 arrives at the input 2 and is sampled in the manner illustrated in FIG. 3. On the basis of the samples B1, C1 and D1, for example, which thus give the binary bit sequence 1, 0, 0, the logic circuit 6 will decide that the oscillator output signal from the output 1a is lagging in phase in relation to the biphase-modulated signal. The bits 1, 0 and 0 thus appear in the respective shift register stages I, II and III, and give rise to binary ones at the outputs from the EXCLUSIVE-OR gates 7 and 8. Since a signal also appears at the oscillator output 1b, the AND gate 9 will emit a binary one to the trigger input of the flip-flop 10, this binary one transferring the incoming binary one from the EXCLUSIVE-OR gate 8 at the data input of the flip-flop 10 to the output thereof so as to cause the oscillator 1 to emit its higher frequency output signal for reducing the phase difference between the oscillator output signal and the incoming biphase-modulated signal.

At the next successive sampling occasion the bit sequence corresponding to the samples C1, D1 and A2 will be in the shift register 5. Since no output signal appears at the oscillator output 1b at this instant, no output signal is obtained from the AND gate 9.

At the next sequential sampling occasion, the bit sequence corresponding to the samples D1, A2 and B2 will be in the shift register 5. The shift register stage I consequently contains a binary zero, but there are binary ones in the stages II and III. In this case also, binary ones are obtained at the outputs of the EXCLUSIVE-OR gates 7 and 8, and since there is a signal at the oscillator output 1b to the AND gate 9 a one is obtained from this gate as well, this one triggering the flip-flop 10 to apply the one coming from the EXCLUSIVE-OR gate 8 to the oscillator 1, causing it to emit the higher frequency output signal in the continued process, since the oscillator 1 is still lagging in phase after the incoming biphase-modulated signal.

The oscillator 1 will emit its higher frequency output signal as long as the samples A and C in FIG. 3 have positive and negative polarity, respectively, i.e. until the sampling instants are displaced such that either an A sample has negative polarity or a C sample positive polarity. Assuming now by way of example that the sample A' in FIG. 2 has negative polarity. In this case the sample B' is positive, while the preceding unillustrated D-sample is assumed negative. These samples result in that the shift register stages I and II will each contain a binary zero, while the stage III will contain a binary one. The EXCLUSIVE-OR gate 8 will accordingly emit a binary zero to the flip-flop 10, while the EXCLUSIVE-OR gate 7 will emit a binary one to the AND gate 9, this one, together with the binary one at the oscillator output 1b gives rise to a binary one at the AND gate output, which binary one in turn triggers the flip-flop to apply the zero from the EXCLUSIVE-OR gate 8 to the oscillator 1, which is hereby caused to emit its lower frequency output signal as a sign that the oscillator is now in advance in phase in relation to the incoming biphase-modulated signal.

Figure 4:
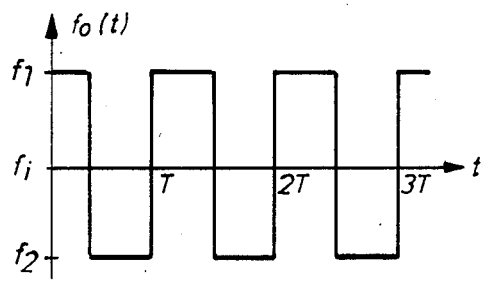
FIG. 4 illustrates the frequency of the oscillator signal as a function of time when the oscillator is in phase with the incoming signal.

The next time the AND gate 9 receives a binary one from the oscillator output 1b is when the samples B', C' and D' are in the shift register stages I, II and III, respectively. In this case the polarity of the sample C' is once again negative, which gives rise to the bit sequence 1, 0, 0 in the respective shift register stages I, II and III. This results in that the EXCLUSIVE-OR gates 7 and 8 emit binary ones as well as the AND gate 9, and consequently a binary one is applied to the control input of the oscillator 1 for causing the oscillator to emit its higher frequence output signal since the oscillator is now lagging in phase after the biphase-modulated input signal. This alternation between the two frequencies of the oscillator output signal is the sign that the oscillator is now in phase with the biphase-modulated input signal. This will be seen from FIG. 4 as a function of time. The oscillator frequency is assumed to alternate between the frequencies f1 and f2, the mean value of which in the illustrated embodiment is assumed to be equal to the frequency fi multiplied by four of the incoming biphase-modulated signal. FIG. 4 illustrates the case described above where it is assumed that the sample A' in FIG. 2 was negative, as well as the sample C'.

Figure 5:
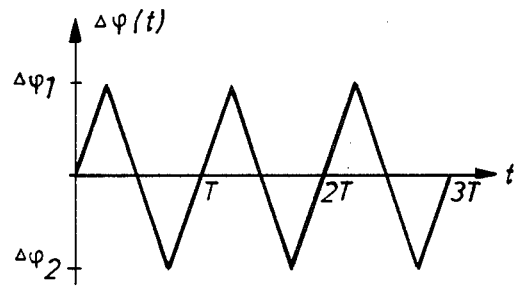
FIG. 5 illustrates the resulting jitter in the oscillator output signal.

The situation illustrated in FIG. 4 gives rise to a change $\Delta\phi$ of the phase position of the sampling rate relative to the phase position of the incoming signal as a function of time according to FIG. 5. The amplitude of this time function, i.e. $\Delta\phi1 - \Delta\phi2$, corresponds to the resulting high-frequency jitter generated by the oscillator 1. This jitter amplitude will naturally be dependent on the frequency difference between the oscillator output signal and the incoming signal. By making this frequency difference small, an arbitrarily low jitter amplitude may be obtained, which is very desirable in certain applications. The thus raised requirement for frequence accuracy can be met, e.g. by making the oscillator 1 crystal-controlled. However, this does not signify any alteration of the basic inventive principle, which thus provides low generated jitter without extra filtering. If the two frequencies f1 and f2 of the oscillator output signal are assumed to differ by +200 ppm and -200 ppm, respectively from the frequency fi of the incoming biphase-modulated signal, the jitter amplitude will be 200 ppm. Since the control signal from the logic circuit 6 to the oscillator 1 furthermore only consists of a binary one or a binary zero, i.e. the sign of the phase error and not its magnitude, jitter in the received signal, e.g. in the form of intersymbol interference, will not affect the magnitude of the control signal to the oscillator 1. There is thus obtained an effective filtration of the jitter in the received signal. Apart from the advantages from the jitter aspect a realization of the apparatus in accordance with the invention by means of integrated circuits is also enabled, since the control signal from the logic circuit 6 to the oscillator 1 is digital.

What we claim is:

1. A periodic signal generator synchronized to an incoming signal whose amplitude continuously varies at a frequency fi comprising: a signal controlled oscillator means for generating either a first signal periodically varying at a first frequency greater than but in the neighborhood of four times the frequency fi in response to the receipt of a first value of a binary signal or a second signal periodically varying at a second frequency less than but in the neighborhood of four times the frequency fi in response to the receipt of a second value of said binary signal; sampling means responsive to said oscillator means periodically sampling the incoming signal for generating for each sampling instant a signal having a first level or a second level dependent on whether the incoming signal at the time of sampling is greater or less than a given voltage level said sampling means comprising a sampling circuit for periodically sampling the incoming signal and comparator for comparing the samples with a given reference voltage level; shift register storage means responsive to said sampling means for storing a set of said signals having the first and second levels; and logic means responsive to said oscillator means to periodically sample said shift register storage means for generating said first or second value of said binary signal in accordance with particular given relationships among the levels of the signals stored in said shift register storage means.

2. The apparatus of claim 1 wherein said shift register storage means has at least three cells and said logic means periodically samples said shift register storage means at one half the frequency of said signal controlled oscillator means.

3. The apparatus of claim 2 wherein said logic means comprises a first exclusive-OR-circuit having inputs connected to the outputs of the first and second of said at least three cells of said shift register storage means and an output, a second exclusive-OR-circuit having inputs connected to the first and third of said a least three cells of said shift register storage means and an output, an AND-circuit having first and second inputs connected to the output of said second exclusive-OR-circuit and said signal controlled oscillator means, respectively, and an output, and a D-flipflop having a trigger input connected to the output of said AND-circuit and a data input connected to the output of said first exclusive-OR-circuit.

* * * * *